US010061173B2

(12) United States Patent
Zhang et al.

(10) Patent No.: US 10,061,173 B2
(45) Date of Patent: Aug. 28, 2018

(54) THIN FILM TRANSISTOR, FABRICATION METHOD THEREOF, AND DISPLAY APPARATUS

(71) Applicant: BOE TECHNOLOGY GROUP CO., LTD., Beijing (CN)

(72) Inventors: Shuai Zhang, Beijing (CN); Yu Cheng Chan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 123 days.

(21) Appl. No.: 15/305,334

(22) PCT Filed: Sep. 15, 2015

(86) PCT No.: PCT/CN2015/089660
§ 371 (c)(1),
(2) Date: Oct. 19, 2016

(87) PCT Pub. No.: WO2017/045137
PCT Pub. Date: Mar. 23, 2017

(65) Prior Publication Data
US 2017/0269409 A1 Sep. 21, 2017

(51) Int. Cl.
*H01L 29/04* (2006.01)
*G02F 1/1368* (2006.01)
(Continued)

(52) U.S. Cl.
CPC ........ *G02F 1/1368* (2013.01); *G02F 1/13439* (2013.01); *G02F 1/134309* (2013.01);
(Continued)

(58) Field of Classification Search
CPC ..... H01L 29/78696; H01L 2924/13061; H01L 29/0669–29/068; H01L 51/057;
(Continued)

(56) References Cited

U.S. PATENT DOCUMENTS 7,582,534 B2 * 9/2009 Afzali-Ardakani .... B82Y 10/00
438/287
2004/0152245 A1 * 8/2004 Madurawe .......... H01L 27/0688
438/164

(Continued)

FOREIGN PATENT DOCUMENTS

CN 101582444 A 11/2009
CN 104241395 A 12/2014
(Continued)

OTHER PUBLICATIONS

The World Intellectual Property Organization (WIPO) International Search Report for PCT/CN2015/089660 Jun. 1, 2016 p. 1-5.

*Primary Examiner* — Kevin M Picardat
(74) *Attorney, Agent, or Firm* — Anova Law Group, PLLC

(57) ABSTRACT

Various embodiments provide a thin film transistor (TFT), a fabrication method thereof, and a display apparatus including the TFT. A carbon nanotube layer is formed over a substrate. The carbon nanotube layer includes a first plurality of carbon nanotubes. A plurality of gaps are formed through the carbon nanotube layer to provide a first patterned carbon nanotube layer. Carbon nanotube structures each including a second plurality of carbon nanotubes are formed in the plurality of gaps. The carbon nanotube structures have a carrier mobility different from the first patterned carbon nanotube layer, thereby forming an active layer for forming active structures of the thin-film transistor.

20 Claims, 3 Drawing Sheets

(51) Int. Cl.
    *G02F 1/1343*     (2006.01)
    *H01L 51/05*     (2006.01)
    *H01L 51/10*     (2006.01)
    *H01L 27/28*     (2006.01)
    *H01L 21/02*     (2006.01)
    *H01L 21/3105*     (2006.01)

(52) U.S. Cl.
    CPC .. *H01L 21/02274* (2013.01); *H01L 21/31053* (2013.01); *H01L 27/283* (2013.01); *H01L 51/057* (2013.01); *H01L 51/105* (2013.01)

(58) Field of Classification Search
    CPC ........... H01L 29/0673; H01L 29/66439; H01L 2924/13088; G02F 1/134309; G02F 1/13439

See application file for complete search history.

(56) References Cited

U.S. PATENT DOCUMENTS

2005/0116336 A1*   6/2005   Chopra .................. B82Y 10/00
                                                                                                 257/720
2010/0133516 A1    6/2010   Lee et al.
2013/0119348 A1*   5/2013   Zhou ..................... H01L 29/775
                                                                                                 257/29

FOREIGN PATENT DOCUMENTS

| CN | 104576744 A | 4/2015 |
| --- | --- | --- |
| CN | 104716047 A | 6/2015 |
| KR | 20050123404 A | 12/2005 |

* cited by examiner

THIN FILM TRANSISTOR, FABRICATION METHOD THEREOF, AND DISPLAY APPARATUS

FIELD OF THE DISCLOSURE

The present disclosure generally relates to the field of display technologies, and, more particularly, relates to a thin film transistor (TFT), a fabrication method of the TFT, and a display apparatus including the TFT.

BACKGROUND

In a thin-film transistor (TFT)-based display, p-type silicon is often used as an active layer. Formation of a TFT-based display using the p-type silicon active layer, however, at least requires a dehydrogenation process, an ion implantation process, an ion activation process, and a hydrogenation process. In addition, incomplete activation and metal ion contamination may occur to affect the p-type Si and thus adversely affect performance of the resultant TFT-based display.

Carbon nanotubes (CNTs) are widely used in nano-electronic and optoelectronic applications. CNTs may have a high carrier mobility of about $10^5$ $cm^2 \cdot V^{-1} \cdot s^{-1}$. In addition, CNTs also have desirable electrical properties, chemical stability, and mechanical ductility, which allow CNTs to have potentials in flexible electronic devices and/or all-carbon circuits.

The disclosed thin film transistors, fabrication methods, and display apparatus are directed to solve one or more problems set forth above and to solve other problems in the art.

BRIEF SUMMARY OF THE DISCLOSURE

One aspect or embodiment of the present disclosure provides a method for forming a thin-film transistor. A carbon nanotube layer is formed over a substrate. The carbon nanotube layer includes a first plurality of carbon nanotubes. A plurality of gaps are formed through the carbon nanotube layer to provide a first patterned carbon nanotube layer. Carbon nanotube structures each including a second plurality of carbon nanotubes are formed in the plurality of gaps. The carbon nanotube structures have a carrier mobility different from the first patterned carbon nanotube layer, thereby forming an active layer for forming active structures of the thin-film transistor.

Optionally, the first plurality of carbon nanotubes in the first patterned carbon nanotube layer are substantially aligned, and the second plurality of carbon nanotubes in the carbon nanotube structures are randomly dispersed.

Optionally, the first plurality of carbon nanotubes are substantially uniformly aligned in a direction parallel with a surface of the substrate. Optionally, the first plurality of carbon nanotubes are substantially uniformly aligned along a length direction of the active layer.

Optionally, the first plurality of carbon nanotubes are substantially uniformly aligned in a direction perpendicular with a surface of the substrate.

Optionally, to form the carbon nanotube layer, a catalyst-containing solution is coated over the substrate and dried. A carbon-source gas is introduced to the catalyst-containing solution to perform a plasma-enhanced chemical vapor deposition (PECVD) to form the first plurality of carbon nanotubes.

Optionally, the catalyst-containing solution includes a catalyst of $Ni(NO_3)_2$, the coated catalyst-containing solution is dried at a temperature of about 500° C., and the carbon-source gas includes $CH_4$.

Optionally, an evaporation-induced self-assembly process is used to form the carbon nanotube structures.

Optionally, to form the carbon nanotube structures, carbon nanotubes are dispersed in a solution, the solution is centrifuged and supernatant is collected, after centrifuging the solution, as a carbon nanotube coating solution. The carbon nanotube coating solution is applied to the gaps in the first patterned layer and dried in the gaps to form the carbon nanotube structures.

Optionally, the collected supernatant is diluted to form the carbon nanotube coating solution. Optionally, the carbon nanotube coating solution is dried under a normal pressure.

Optionally, a photoresist pattern is formed over the carbon nanotube layer. The photoresist pattern is used as an etch mask to form the plurality of gaps in the first patterned carbon nanotube layer. The photoresist pattern remains on the first patterned carbon nanotube layer when forming the carbon nanotube structures in the plurality of gaps.

Optionally, a chemical mechanical polishing (CMP) process is performed on the first patterned carbon nanotube layer and the carbon nanotube structures to provide a substantially coplanar surface between the first patterned carbon nanotube layer and the carbon nanotube structures.

Optionally, the first patterned carbon nanotube layer is etched to form a second patterned carbon nanotube layer, while the carbon nanotube structures remain unchanged in the second patterned carbon nanotube layer, thereby forming the active structures of the thin-film transistor, wherein each active structure comprises two carbon nanotube structures.

Optionally, a gate insulating layer is formed over the second patterned carbon nanotube layer, and an electrical conductive layer over the gate insulating layer is patterned to form a gate electrode on the gate insulating layer.

Optionally, the gate electrode is formed to cover a portion of the second patterned carbon nanotube layer between adjacent carbon nanotube structures. Optionally, the gate electrode is formed to have ends each overlap with one adjacent carbon nanotube structure.

Optionally, an interlayer dielectric layer is formed over the gate electrode and the gate insulating layer. Via-holes are formed through the interlayer dielectric layer, and adjacent two carbon nanotube structures are within the adjacent via-holes. Simultaneously, conductive materials are formed in the via-holes and an electrical conducive layer is formed over the interlayer dielectric layer. Source and drain electrodes are formed by patterning the electrical conducive layer.

Optionally, the carbon nanotube structures are included in a drain region or a source region of the thin film transistor. Optionally, a buffer layer is formed over the substrate before forming the nanotube structure layer over the substrate.

Another aspect or embodiment of the present disclosure provides a thin film transistor including an active layer over a substrate. The active layer includes carbon nanotube structures interspersed through a carbon nanotube layer. The carbon nanotube layer includes a first plurality of carbon nanotubes. The carbon nanotube structures include a second plurality of carbon nanotubes to provide a carrier mobility in the carbon nanotube structures different from a carrier mobility in the carbon nanotube layer.

Optionally, the first plurality of carbon nanotubes are substantially aligned in the carbon nanotube layer, and the second plurality of carbon nanotubes are randomly dispersed in the carbon nanotube structures. Optionally, the first plurality of carbon nanotubes are substantially uniformly aligned in a direction parallel with a surface of the substrate.

Optionally, the first plurality of carbon nanotubes are substantially uniformly aligned along a length direction of the active layer. Optionally, the first plurality of carbon nanotubes are substantially uniformly aligned in a direction perpendicular with a surface of the substrate.

Optionally, a gate insulating layer is over the active layer, and a gate electrode is on the gate insulating layer. Optionally, the gate electrode is configured to cover a portion of the carbon nanotube layer between adjacent carbon nanotube structures. Optionally, the gate electrode is configured to have ends each overlap with one adjacent carbon nanotube structure.

Optionally, an interlayer dielectric layer is over the gate electrode and the gate insulating layer, the interlayer dielectric layer includes via-holes, and adjacent two carbon nanotube structures are configured within adjacent via-holes. Conductive materials are in the via-holes, and source and drain electrodes are over the interlayer dielectric layer.

Optionally, the carbon nanotube structures are included in a drain region or a source region of the thin film transistor. Optionally, a buffer layer is over the substrate.

Another aspect or embodiment of the present disclosure provides a display apparatus including the disclosed thin film transistors.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the disclosure.

DETAILED DESCRIPTION

Figure 1:
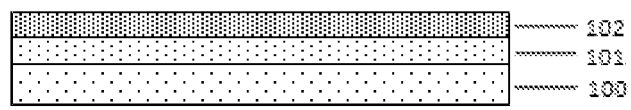
FIGS. 1-13 illustrate exemplary structures of a TFT at various stages during its formation in accordance with various disclosed embodiments.

Reference will now be made in detail to exemplary embodiments of the disclosure, which are illustrated in the accompanying drawings. Wherever possible, the same reference numbers will be used throughout the drawings to refer to the same or like parts.

The present disclosure provides a thin film transistor (TFT), a fabrication method of the TFT, and a display apparatus including the TFT. The TFT may include an active layer including a carbon nanotube (CNT) layer having openings or gaps through the CNT layer and carbon nanotube (CNT) structures arranged in the gaps. The CNT layer having openings or gaps may also be referred to as a patterned CNT layer.

CNTs in the CNT layer and CNTs in the carbon nanotube structures are arranged, e.g., aligned, differently. For example, the active layer of the TFT may include the patterned CNT layer containing aligned or oriented CNTs and may also include carbon nanotube structures containing CNTs that are randomly dispersed but not aligned or oriented. The patterned CNT layer and the carbon nanotube structures may be formed using different processes.

The CNT layer or patterned CNT layer, as well as the carbon nanotube structures may provide different carrier mobility. In one embodiment, the CNT layer may be controlled to have a carrier mobility ranging from about $10^2$ $cm^2 \cdot V^{-1} \cdot s^{-1}$ to about $10^5$ $cm^2 \cdot V^{-1} \cdot s^{-1}$, while the carrier mobility of the carbon nanotube structures may be significantly reduced by about 10% to about 100%.

In various embodiments, the carbon nanotube structures may be used in a drain region and/or source region. For example, the carbon nanotube structures may be used to replace conventional lightly-doped drain/source but at least have functions of conventional lightly-doped drain/source. As such, unlike conventional active layers, the disclosed active layer does not require dehydrogenation, doping, RTA and hydrogenation process, but can provide high carrier mobility for the resultant device.

In addition, due to the nano-scale size of the CNTs with desirable electrical properties, the disclosed TFT may be formed in a scale of submicron or smaller, and may not be affected by ionic contamination, which may occur to conventional P—Si active layer structure, and thus the TFT can be more stable. The pixels per inch (PPI) of the resultant display apparatus formed including TFT s may be significantly increased.

As used herein and unless otherwise specified, the term "nanotubes" refers to an elongated material formed by organic and inorganic materials having at least one minor dimension, for example, width or diameter, of about 500 nanometers or less. Although the term "nanotubes" is used herein for illustration purposes, it is intended that the term also encompasses other elongated structures of like dimensions including, but not limited to, nanoshafts, nanopillars, nanowires, nanorods, and nanoneedles and their various functionalized and derivatized fibril forms, which include nanofibers with forms of thread, yarn, fabrics, etc.

The carbon nanotubes (CNTs) can be carbon-containing nanotubes. CNTs may include single wall carbon nanotubes (SWCNTs), double-wall carbon nanotubes (DWCNTs), multi-wall carbon nanotubes (MWCNTs), and their various functionalized and derivatized fibril forms such as carbon nanofibers. The nanotubes can have an inside diameter and an outside diameter. For example, the average inside diameter can range from about 1 nanometer to about 20 nanometers, while the average outside diameter can range from about 5 nanometers to about 100 nanometers. Alternatively, the nanotubes can have an average aspect ratio ranging from about 10 to about 1,000,000.

FIGS. 1-13 illustrate exemplary structures of a TFT at various stages during its formation in accordance with various disclosed embodiments.

In FIG. 1, a substrate 100 is provided. A carbon nanotube (CNT) layer 102 is formed over the buffer layer 101. In one embodiment, a buffer layer 101 is formed between the substrate 100 and the CNT layer 102.

The substrate 100 may be made of an optically transparent material, such as glass, plastic or any suitable material. Before forming the buffer layer 101, the substrate 100 may be washed and cleaned.

The buffer layer 101 may be formed over the substrate 100 by, for example, a plasma-enhanced chemical vapor deposition (PECVD) process, to form a continuous layer on the substrate 100. In one embodiment, the buffer layer 101 may be made of silicon oxide, silicon nitride, and/or other suitable materials. For example, the buffer layer 101 may be a single layer formed by one material or may be a composite layer formed by one or more materials, or may be a stacked layer including one or more material in each layer. When silicon oxide is used for the buffer layer 101, the silicon oxide layer may have a thickness of about 50 nm to about 100 nm. When silicon nitride is used for the buffer layer 101, the silicon nitride layer may have a thickness of about 100 nm to about 300 nm. In some cases, the buffer layer 101 is optional.

The CNT layer 102 may be formed over the buffer layer 101. In one embodiment, the CNT layer 102 may be formed by, for example, plasma-enhanced chemical vapor deposition (PECVD), evaporation-induced self-assembly, or any suitable process, provided that CNTs formed in the CNT layer 102 may be substantially aligned or otherwise oriented in one or more certain directions within the CNT layer 102. For example, the CNTs may be aligned along a direction parallel with or perpendicular to a surface of the substrate. In a certain embodiment, the CNTs may be aligned along a length direction of the CNT layer 102 of the active layer.

In one embodiment, the buffer layer 101 may be coated, e.g., by a spin-coating process, with a solution containing a catalyst for forming CNTs. The coated solution on the buffer layer 101 may be dried and maintained at a certain temperature, while a carbon-source gas is introduced to the coated buffer layer. Carrier gas, e.g., including $H_2$ and/or $N_2$, may also be introduced simultaneously. A PECVD process may then be performed to prepare CNTs, for example, aligned in parallel with a surface of the buffer layer 101 or a surface of the substrate 100. Parameters in the PECVD process for forming the CTN layer 102, including, for example, radio frequency (RF) power, ratios between the introduced gases, reaction time, reaction temperature, etc. may be adjusted or controlled during the PECVD process to prepare disclosed CNTs in the CNT layer 102.

In various embodiments, the catalyst-containing solution may include a catalyst of $Ni(NO_3)_2$, having a concentration of about 0.1 mol/L. The coated solution may be dried and maintained at a temperature of about 500° C. The carbon-source containing gas may include $CH_4$ or other possible carbon source material. In this case, the reaction may include:

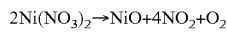

$$2Ni(NO_3)_2 \rightarrow NiO + 4NO_2 + O_2$$

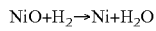

$$NiO + H_2 \rightarrow Ni + H_2O$$

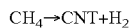

$$CH_4 \rightarrow CNT + H_2$$

The exemplary carbon-source material $CH_4$ is catalyzed by Ni to undergo a catalytic cracking reaction to form CNTs in the CNT layer.

Figure 2:
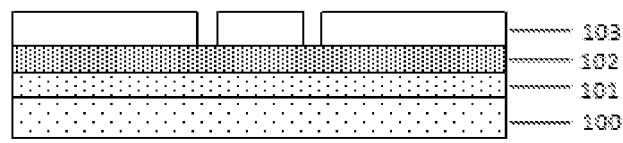

In FIG. 2, a photoresist pattern 103 may be formed, e.g., by a photolithographic process, over the CNT layer 102.

Figure 3:
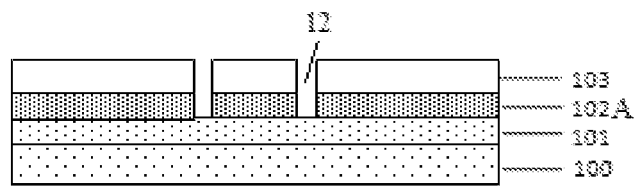

In FIG. 3, a first patterned CNT layer 102A may be formed by patterning the CNT layer 102. For example, the CNT layer 102 may be etched using the photoresist pattern 103 as an etch mask to form the first patterned layer 102A. The first patterned layer 102A may include openings 12 through the patterned CNT layer 102A.

To form the openings 12, the CNT layer 102 may be etched by, e.g., a dry etching using an etch gas including $Cl_2$, $O_2$ and $H_2$ in a gas mixture.

After forming the openings 12, the photoresist pattern 103 may remain on the formed first CNT layer patter 102A and may be used to subsequently form carbon nanotube structures 112 in the first patterned layer 102A.

Figure 4:
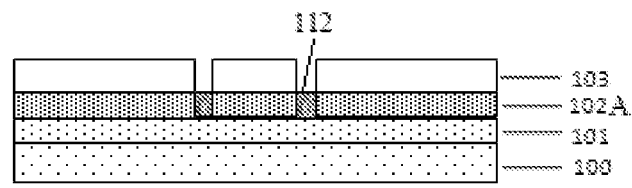

In FIG. 4, the carbon nanotube (e.g., lightly-doped drain, LDD) structures 112 may be formed in the openings 12 within the first patterned layer 102A and over the buffer layer 101. For example, the carbon nanotube structures 112 may be formed to include randomly arranged CNTs. In various embodiments, the arrangement of CNTs in the carbon nanotube structures 112 and in the first patterned layer 102A may be different from one another. For example, CNTs in the carbon nanotube structures 112 may be the randomly arranged, while CNTs in the first patterned layer 102A may be uniformly aligned or oriented in a direction parallel with or perpendicular with a surface of the substrate 100.

In one embodiment, to form the carbon nanotube structures 112, an evaporation-induced self-assembly process may be used. For example, solid CNTs may be pre-prepared or otherwise obtained, having carbon purity of about 99.5% or greater. The solid CNTs may be dissolved in a solution, e.g., in a sodium dodecyl sulfate (SDS) solution of about 1% by weight. In various embodiments, an ultrasonic instrument may be used to facilitate uniform dispersing of CNTs in the solution. The CNT-dispersed solution may then be centrifuged. After the centrifugation, the supernatant may be collected and diluted, for example, by 3-5 times, to form a CNT coating solution.

The CNT coating solution may be applied to the structure shown in FIG. 3 having the photoresist pattern 103. For example, the CNT coating solution may be applied in the openings 12 of the first patterned layer 102A and then dried, e.g., at normal pressure. Randomly dispersed CNTs are then formed in the openings 12 of the first patterned layer 102A to form the carbon nanotube structures 112, as shown in FIG. 4.

Figure 5:
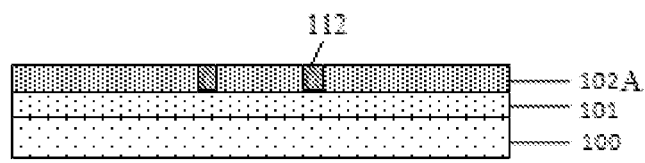

The photoresist pattern 103 in FIG. 4 may be removed to expose the first patterned layer 102A and the carbon nanotube structures 112. In various embodiments, a chemical mechanical polishing (CMP) process may be applied to the first patterned layer 102A and the carbon nanotube structures 112 to provide a coplanar surface thereof, as shown in FIG. 5.

Figure 6:
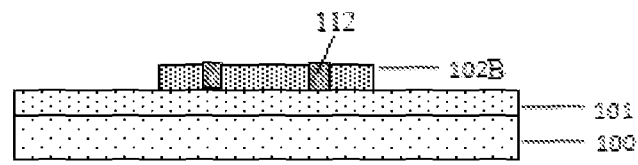

In FIG. 6, a portion of the first patterned layer 102A may be further removed, while the carbon nanotube structures 112 remain unchanged, to form a second patterned CNT layer 102B containing the carbon nanotube structures 112. For example, end portions of the first CNT layer 102 may be removed, e.g., by a dry etching using a etch gas including $Cl_2$, $O_2$, and/or $H_2$, using a photoresist pattern (not shown) as an etch mask in a typical photolithographic process.

Figure 7:
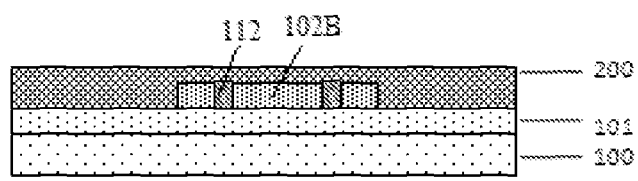

In FIG. 7, a gate insulating layer 200 may be formed on the second patterned CNT layer 102B containing the carbon nanotube structures 112 and on the exposed surface portion of the buffer layer 101. In some cases, the buffer layer 101 may be optional and the gate insulating layer 200 may be formed on the second patterned CNT layer 102B containing the carbon nanotube structures 112 and on the exposed surface portion of the substrate 100. The gate insulating layer 200 may be formed, e.g., by a PECVD process.

Figure 8:
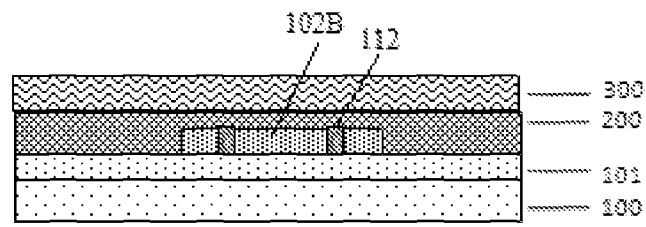
Figure 9:
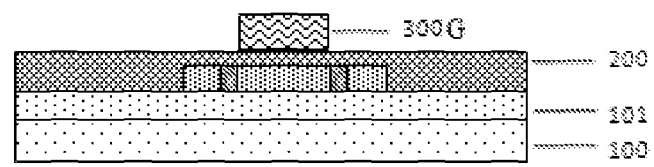

In FIG. 8, an electrical conductive layer 300, such as a gate metal layer, may be formed, for example, by a sputtering process, over the gate insulating layer 200. The electrical conductive layer 300 may then be patterned, for example, by a photolithographic process, to form a gate electrode 300G as shown in FIG. 9.

In various embodiments, the position and dimensions of the gate electrode 300G may be arranged with respect to the position and dimension of the carbon nanotube structures 112 in the second patterned CNT layer 102B, provided that the at least a portion of each of the carbon nanotube structures 112 is exposed.

For example, the gate electrode 300G may be formed over the second patterned CNT layer 102B to substantially cover a portion of the second patterned CNT layer 102B that is between adjacent carbon nanotube structures 112. In this case, one end of the gate electrode 300G may be aligned with an inner end of one of the adjacent carbon nanotube structures 112, while the other end of the gate electrode 300G may be aligned with an inner end of the other of the adjacent carbon nanotube structures 112, as shown in FIG. 9. In another example, the gate electrode 300G may be formed over the second patterned CNT layer 102B to have one end overlap with one of the adjacent carbon nanotube structures 112 and/or to have the other end overlap with the other of the adjacent carbon nanotube structures 112.

Figure 10:
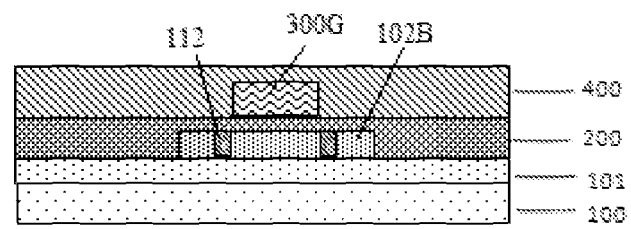

In FIG. 10, an interlayer dielectric (ILD) layer 400 may be formed over the gate electrode 300G and over the exposed surface of the gate insulating layer 200. For example, the ILD layer 400 may be formed by a PECVD process.

Figure 11:
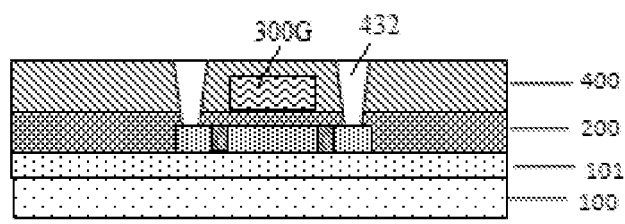

In FIG. 11, via-holes 432 may be formed through the ILD layer 400 and partially through the gate insulating layer 200 to expose surface portions of the second patterned CNT layer 102B. The via-holes 432 may be formed, such that adjacent carbon nanotube structures 112 are configured between adjacent via-holes 432.

Figure 12:
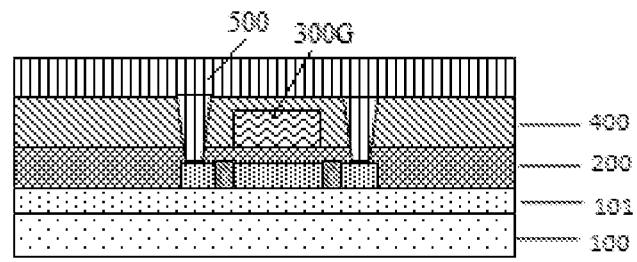

In FIG. 12, a second electrical conductive layer 500 may be formed on the ILD layer 400, for example, by a sputtering process. In various embodiments, electrical conductive materials, such as metals with low work function, may be used to form the electrical conductive layer 500 to provide desirable ohmic contact with CNTs of the second patterned CNT layer 102B. Exemplary metals with low work function may include scandium (Sc) and/or yttrium (Y). Such metals may further provide desired adhesion with single or multiple layers made of silicon oxide and/or silicon nitride for the buffer layer 101.

Note that when forming the electrical conductive layer 500, corresponding conductive material(s) may simultaneously fill the via-holes 432 as shown in FIG. 12 as conductive materials connecting to the second patterned CNT layer 102B.

Figure 13:
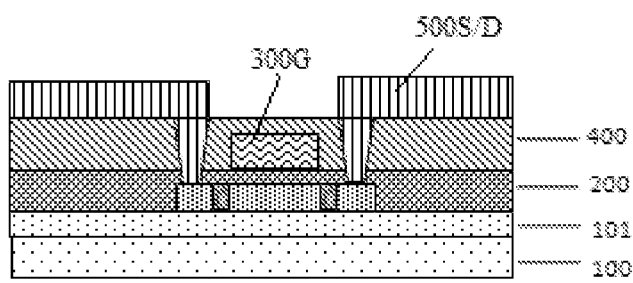

In FIG. 13, the electrical conductive layer 500 may be etched to form source/drain electrode 500S/D, e.g., by a photolithographic process. The S/D electrode 500S/D may be formed to expose a portion of ILD 400 that is between adjacent via-holes 432 filled with conductive materials. The S/D electrode 500S/D is connected to the conductive material in the adjacent via-holes 432.

In various embodiments, the conductive material may include, for example, a metal, an indium zinc oxide (IZO), an indium tin oxide (ITO), a polysilicon, or a combination thereof.

In this manner, the carbon nanotube structures 112 may thus be formed, interspersed through the first patterned carbon nanotube layer 102A in FIGS. 4-5, and the second patterned carbon nanotube layer 102B in FIGS. 6-13. For example, the carbon nanotube structures 112 may be interspersed through the first or second patterned CNT layer 102A/B along an entire thickness of the patterned CNT layer 120A/B.

The patterned CNT layer, such as, the second patterned CNT layer 102B containing CNTs may be used as an active layer for forming active structures of a TFT. In one embodiment, each active structure may include two carbon nanotube structures. The active layer of the TFT may include the patterned CNT layer containing aligned or oriented CNTs and also include carbon nanotube structures containing CNTs that are not aligned or oriented. The patterned CNT layer and the carbon nanotube structures may be formed using different processes. Generally, carbon nanotubes may have carrier mobility up to about $10^5$ cm$^2 \cdot$V$^{-1} \cdot$s$^{-1}$. Unlike conventional active layers, the disclosed active layer does not require dehydrogenation, doping, RTA and hydrogenation process, but can provide high carrier mobility for the resultant device.

In addition, due to the nano-scale size of the CNTs with desirable electrical properties, the disclosed TFT may be formed in a scale of submicron or smaller, and may not be affected by ionic contamination, which may occur to conventional P—Si active layer structure, and thus the TFT can be more stable. The pixels per inch (PPI) of the resultant display apparatus formed including TFT s may be significantly increased.

Various embodiments also include an array substrate including the disclosed TFT. Such array substrate may be used in a display apparatus, for example, an active-matrix liquid-crystal display (AMLCD) and/or an active-matrix organic liquid-crystal display (AMOLCD).

For example, a matrix of the TFTs may be used for constructing an active matrix to make a TFT liquid-crystal display (LCD) apparatus. The TFTs may store the electrical state of each pixel on the display while all the other pixels are being updated. In some cases, a thin-film transistor is one component in an active matrix and other components such as diodes may be used in the active-matrix.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for forming a thin-film transistor, comprising:
   forming a carbon nanotube layer over a substrate, the carbon nanotube layer comprising a first plurality of carbon nanotubes;
   forming a plurality of gaps through the carbon nanotube layer to provide a first patterned carbon nanotube layer; and
   forming carbon nanotube structures each including a second plurality of carbon nanotubes in the plurality of gaps, and the carbon nanotube structures having a carrier mobility different from the first patterned carbon nanotube layer, thereby forming an active layer for forming active structures of the thin-film transistor.

2. The method according to claim 1, wherein:
   the first plurality of carbon nanotubes in the first patterned carbon nanotube layer are substantially aligned, and
   the second plurality of carbon nanotubes in the carbon nanotube structures are randomly dispersed.

3. The method according to claim 1, wherein forming the carbon nanotube layer includes:
   coating a catalyst-containing solution over the substrate,
   drying the coated catalyst-containing solution, and
   introducing a carbon-source gas to the catalyst-containing solution to perform a plasma-enhanced chemical vapor deposition (PECVD) to form the first plurality of carbon nanotubes.

4. The method according to claim 3, wherein:
   the catalyst-containing solution includes a catalyst of Ni(NO$_3$)$_2$,
   the coated catalyst-containing solution is dried at a temperature of about 500° C., and
   the carbon-source gas includes CH$_4$.

5. The method according to claim 1, wherein forming the carbon nanotube structures includes an evaporation-induced self-assembly process including:
dispersing carbon nanotubes in a solution,
centrifuging the solution,
collecting supernatant, after centrifuging the solution, as a carbon nanotube coating solution,
applying the carbon nanotube coating solution to the gaps in the first patterned layer, and
drying the carbon nanotube coating solution in the gaps to form the carbon nanotube structures.

6. The method according to claim 1, further including:
forming a photoresist pattern over the carbon nanotube layer,
wherein:
the photoresist pattern is used as an etch mask to form the plurality of gaps in the first patterned carbon nanotube layer, and
the photoresist pattern remains on the first patterned carbon nanotube layer when forming the carbon nanotube structures in the plurality of gaps.

7. The method according to claim 1, further including:
performing a chemical mechanical polishing (CMP) process on the first patterned carbon nanotube layer and the carbon nanotube structures to provide a substantially coplanar surface between the first patterned carbon nanotube layer and the carbon nanotube structures.

8. The method according to claim 1, further including:
etching the first patterned carbon nanotube layer to form a second patterned carbon nanotube layer, while the carbon nanotube structures remain unchanged in the second patterned carbon nanotube layer, thereby forming the active structures of the thin-film transistor, wherein each active structure comprises two carbon nanotube structures.

9. The method according to claim 8, further including:
forming a gate insulating layer over the second patterned carbon nanotube layer, and
patterning an electrical conductive layer over the gate insulating layer to form a gate electrode on the gate insulating layer.

10. The method according to claim 9, further including:
forming an interlayer dielectric layer over the gate electrode and the gate insulating layer,
forming via-holes through the interlayer dielectric layer, wherein adjacent two carbon nanotube structures are within the adjacent via-holes,
simultaneously forming conductive materials in the via-holes and an electrical conducive layer over the interlayer dielectric layer, and
forming source and drain electrodes by patterning the electrical conducive layer.

11. The method according to claim 1, wherein the carbon nanotube structures are included in a drain region or a source region of the thin film transistor.

12. A thin film transistor, comprising:
an active layer over a substrate,
wherein:
the active layer includes carbon nanotube structures interspersed through a carbon nanotube layer;
the carbon nanotube layer includes a first plurality of carbon nanotubes;
the carbon nanotube structures include a second plurality of carbon nanotubes to provide a carrier mobility in the carbon nanotube structures different from a carrier mobility in the carbon nanotube layer; and
an arrangement of the second plurality of carbon nanotubes is different from an arrangement of the first plurality of carbon nanotubes.

13. The transistor according to claim 12, wherein:
the first plurality of carbon nanotubes are substantially aligned in the carbon nanotube layer, and
the second plurality of carbon nanotubes are randomly dispersed in the carbon nanotube structures.

14. The transistor according to claim 12, further including:
a gate insulating layer over the active layer, and
a gate electrode on the gate insulating layer.

15. The transistor according to claim 14, wherein:
the gate electrode is configured to cover a portion of the carbon nanotube layer between adjacent carbon nanotube structures.

16. The transistor according to claim 14, wherein:
the gate electrode is configured to have ends each overlap with one adjacent carbon nanotube structure.

17. The transistor according to claim 14, further including:
an interlayer dielectric layer over the gate electrode and the gate insulating layer, wherein the interlayer dielectric layer includes via-holes, adjacent two carbon nanotube structures are configured within adjacent via-holes,
conductive materials in the via-holes, and
source and drain electrodes over the interlayer dielectric layer.

18. The transistor according to claim 12, wherein the carbon nanotube structures are included in a drain region or a source region of the thin film transistor.

19. The transistor according to claim 12, further including a buffer layer over the substrate.

20. A display apparatus comprising the transistor according to claim 12.

* * * * *